(12) United States Patent
Cho et al.

(10) Patent No.: US 7,919,350 B2
(45) Date of Patent: Apr. 5, 2011

(54) IMAGE SENSOR AND METHOD OF MAKING SAME

(75) Inventors: Jung-Hyun Cho, Suwon-si (KR); Jae-Ku Lee, Hwaseong-si (KR); Sun-Wook Heo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1258 days.

(21) Appl. No.: 11/509,988

(22) Filed: Aug. 25, 2006

(65) Prior Publication Data
US 2007/0065972 A1    Mar. 22, 2007

(30) Foreign Application Priority Data

Sep. 22, 2005   (KR) .................. 10-2005-0088242

(51) Int. Cl.
*H01L 21/00* (2006.01)
(52) U.S. Cl. ............ 438/70; 438/69; 438/781; 257/432; 257/440; 257/E31.122
(58) Field of Classification Search .................... 438/69, 438/70, 781; 257/432, 440, E31.122
See application file for complete search history.

(56) References Cited

U.S. PATENT DOCUMENTS

| 6,285,065 | B1 * | 9/2001 | Levy ............................. 257/440 |
| 6,297,071 | B1 * | 10/2001 | Wake ............................. 438/70 |
| 6,818,962 | B2 * | 11/2004 | Yamamoto .................... 257/432 |
| 7,129,108 | B2 * | 10/2006 | Jang ............................. 438/70 |

FOREIGN PATENT DOCUMENTS

| JP | 2005-142468 | 6/2005 |
| KR | 1020000041458 | 7/2000 |
| KR | 10-2002-0052800 | 7/2002 |
| KR | 1020020052713 | 7/2002 |

OTHER PUBLICATIONS

Notice to File a Response/Amendment to the Examination Report and English-language translation issued Nov. 10, 2006 in counterpart Korean application No. 10-2005-0088242.

* cited by examiner

*Primary Examiner* — Zandra Smith
*Assistant Examiner* — Christy L Novacek
(74) *Attorney, Agent, or Firm* — Mills & Onello, LLP

(57) ABSTRACT

An image sensor is formed by providing a semiconductor substrate having first, second and third pixel regions and first and second color filters disposed on their respective pixel regions. A photoresist layer is coated over the first and second color filters and the third color pixel region. The photoresist is removed from the first and second color filters, leaving a third color filter of substantially the same height as the first and second color filters. Micro lenses may then be formed on the color filters.

18 Claims, 8 Drawing Sheets

IMAGE SENSOR AND METHOD OF MAKING SAME

CROSS-REFERENCE TO RELATED APPLICATIONS

This U.S. non-provisional patent application claims priority under 35 U.S.C §119 of Korean Patent Application 2005-88242 filed on Sep. 22, 2005, the entire contents of which are hereby incorporated by reference.

BACKGROUND OF THE INVENTION

The present invention relates to a method of making an image sensor and the sensor so formed.

An image sensor is a device that transforms an optical image into an electric signal. Types of image sensors include a complementary metal-oxide-silicon (CMOS) image sensor and a charge coupled device (CCD) image sensor, as examples. In either case, associated with a pixel of an image sensor are photodiodes for receiving light and transistors for controlling image signals input from the photodiodes. In the photodiodes, electron-hole pairs are generated according to wavelengths and strengths of red, green, and blue lights irradiated through color filters having red, green, and blue colors, respectively. An output signal is changed according to an amount of the generated electrons. In this manner, an image may be sensed.

The color filters are formed by carrying out photolithography processes three times on a bottom planarization layer of a semiconductor substrate, one time for each color filter. This forms a color filter array. A photolithography process includes very complicated processes, such as a coating process for coating a photoresist onto a wafer, a soft bake process for removing solvents contained in the photoresist after coating the photoresist, an exposure process for aligning a photo mask on a wafer coated with the photoresist and irradiating the photoresist with lights through the photomask, a post-bake process for hardening the photoresist, and a developing process for developing the photoresist according to a photoresist pattern. Accordingly, a process of forming a color filter array in an image sensor may be complicated.

Since a color filter array having three colors is formed by performing a photolithography process for each color filter, it is difficult to control equally a thickness of color filters having different colors. Therefore, thicknesses of the color filters tend to differ, causing their heights to be significantly different, so their upper surfaces are not at substantially the same height. If micro lenses are directly formed on the color filters having different heights, it is difficult for micro lenses to have identical forms. This results in micro lenses having different focal distances, which decreases light-transmission uniformity among the pixels. In order to prevent this, before forming the micro lenses, an upper planarization layer having a flat upper surface is formed on the color filters. Adding the upper planarization layer increases the distance between the micro lenses and photodiodes, causing the amount of light reaching the photodiodes to be decreased. As a result, photosensitivity is reduced.

SUMMARY OF THE INVENTION

In accordance with one aspect of the present disclosure, provided is a method of forming an image sensor. The method comprises providing a semiconductor substrate having a first pixel region, a second pixel region, and a third pixel region. The method further includes forming, on the semiconductor substrate, a first color filter of a first color on the first pixel region and a second color filter of a second color on the second pixel region. The method continues with coating a color photoresist of a third color on at least the third pixel region, and then baking the color photoresist. The method then includes removing at least some of the color photoresist to form a third color filter on the third pixel region, such that the first, second and third color filters have substantially the same height.

In various embodiments, the color photoresist is removed using a planarization process. In such embodiments, the planarization process may be an etch back process. The etch back process may be carried out using at least one gas selected from the group comprising nitrogen, oxygen, and carbon tetrafluoride.

In the above method the color photoresist may be a negative type, wherein the method may then comprise exposing an entire surface of the color photoresist to light before the planarization process. In such a case, the method may further comprise, after exposing the entire surface of the color photoresist to light, hard baking the color photoresist.

In various embodiments, the above method may further comprise forming micro lenses on one or more of the first, the second, and the third color filters. The method may then include, before forming the first and the second color filters, forming a planarization layer on substantially all of an upper surface of the semiconductor substrate, including forming the planarization layer on the first pixel region, the second pixel region, and the third pixel region.

In various embodiments, the semiconductor substrate may further include a pad region, and the method may include, before forming the planarization layer, forming a conductive pad electrically coupled to the semiconductor substrate in the pad region and then forming the planarization layer on the conductive pad. The step of performing the planarization process may comprise leaving a remnant color photoresist on the pad region. In such a case, the method may also include removing the planarization layer and the remnant color photoresist to expose the conductive pad in the pad region.

In accordance with another aspect of the disclosure, provided is another method of forming an image sensor. This method comprises providing a semiconductor substrate having a first pixel region, a second pixel region, a third pixel region, and a pad region. The method includes forming a conductive pad electrically coupled to the semiconductor substrate in the pad region. The method also includes forming a planarization layer on substantially all of an upper surface of the semiconductor substrate, including forming the planarization layer on the first pixel region, the second pixel region, the third pixel region and the pad region. A first color filter is formed on the first pixel region and a second color filter is formed on the second pixel region. Then a coating of a color photoresist of a third color is applied on the first color filter, the second color filter, the third pixel region and the pad region. The color photoresist is then baked. A planarization process is used to remove the color photoresist on the first and the second color filters, to form a third color filter in the third pixel region, and may also form a residuary color photoresist in the pad region.

In accordance with various aspect of the above method, the planarization process may be an etch back process, wherein the etch back process may be carried out using at least one gas selected from the group comprising nitrogen, oxygen, and carbon tetrafluoride.

The color photoresist may be a negative type, wherein the method may further comprise exposing an entire surface of the color photoresist to light before the planarization process.

After exposing the entire surface of the color photoresist to light, the method may include hard baking the color photoresist. The method may further comprise removing the residuary color photoresist and the planarization layer to expose the conductive pad in the pad region.

In accordance with various aspects of the disclosure, micro lenses may be formed on one or more of the first, the second, and the third color filters.

In accordance with other aspects of the present disclosure, an image sensor may be provided comprising a semiconductor substrate having a first pixel region, a second pixel region, and a third pixel region. A first color filter is disposed on the first pixel region, a second color filter is disposed on the second pixel region, and a third color filter is disposed on the third pixel region, wherein the first, the second, and the third color filters have substantially flat upper surfaces and are of substantially the same height. The image sensor may also include at least one of a first micro lens disposed directly on the first color filter, a second micro lens disposed directly on the second color filter, and a third micro lens disposed directly on the third color filter.

The semiconductor substrate may further include a pad region, and the image sensor may further comprise a conductive pad disposed on the semiconductor substrate of the pad region. The image sensor may also comprise a planarization layer interposed between the color filters and the semiconductor substrate.

In accordance with yet another aspect of the disclosure, provide is a method of forming an image sensor, comprising providing a semiconductor substrate having a first pixel region, a second pixel region and a third pixel region. On an upper surface of the semiconductor substrate, formed are a first color filter of a first color on the first pixel region and a second color filter of a second color on the second pixel region. The method includes coating a color photoresist of a third color on substantially all of the upper surface, including coating the first and second color filters and the third pixel region, and then baking the color photoresist. The color photoresist is then removed from the upper surface, while maintaining a portion of the color photoresist on the third pixel region to form a third color filter on the third pixel region, such that the color photoresist is removed from the first color filter and the second color filter and the first, the second and the third color filters have substantially the same height.

BRIEF DESCRIPTION OF THE DRAWINGS

The foregoing and objects, features and advantages of the invention will be apparent from the more particular description of the preferred embodiments below, as illustrated in the accompanying drawings, in which like reference characters refer to the same parts throughout the different views. The drawings are not necessarily to scale, emphasis instead being placed on illustrating the principles of the invention.

DETAILED DESCRIPTION OF PREFERRED EMBODIMENTS

Figure 1:
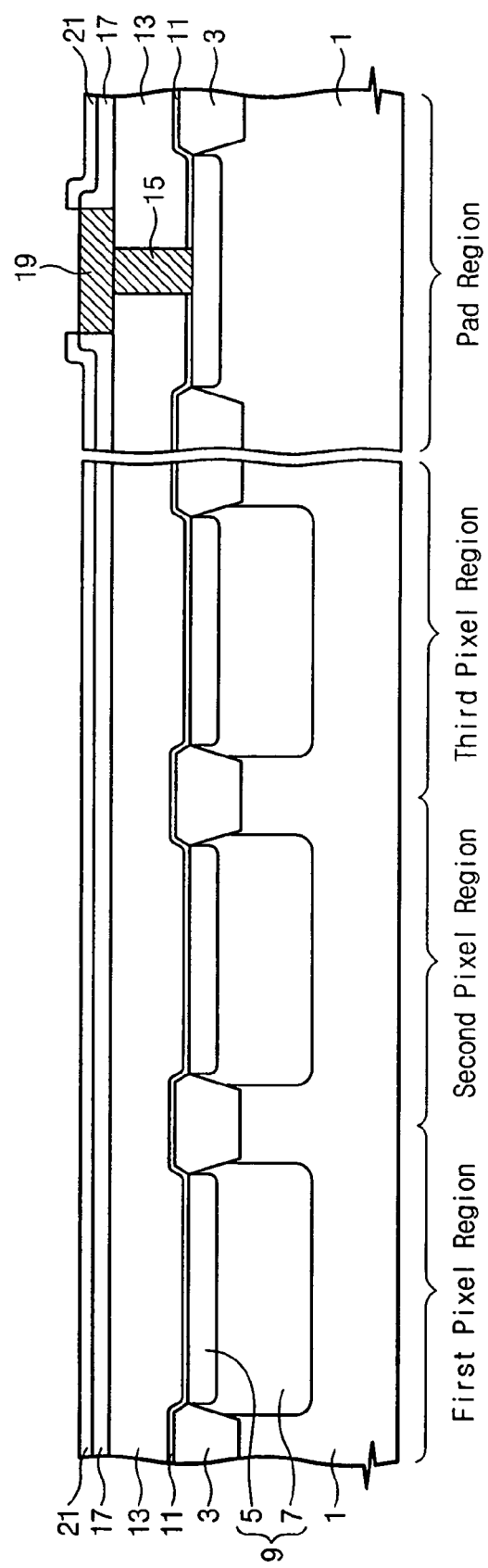
FIGS. 1 through 8 are cross-sectional views illustrating a method of making an image sensor according to an exemplary embodiment of the present disclosure.

A method of making an image sensor and the sensor so formed will now be described more fully hereinafter with reference to the accompanying drawings, in which preferred embodiments thereof are shown. This method and image sensor, however, may be embodied in many different forms and should not be construed as limited to the embodiments set forth herein. Rather, these embodiments are provided so that this disclosure will be thorough. In the drawings, the thicknesses of layers and regions are exaggerated for clarity. It will also be understood that when a layer is referred to as being "on" another layer or substrate, it can be directly on the other layer or substrate, or intervening layers may also be present. Like numbers refer to like elements throughout. In the embodiments, a photodiode may be a photoelectric charge-part, where charges are formed by incident light. The embodiments of the present disclosure may be applied to various image sensors, such as a CMOS image sensor, a CCD image sensor and so on.

Referring to FIG. 1, a device isolation layer 3 is formed on a semiconductor substrate 1 having a first pixel region, a second pixel region, and a third pixel region, and may also include a pad region, which defines an active region. The pad region is defined as a region where a conductive pad is formed for applying a voltage from an external source located in, for example, a peripheral circuit region. The device isolation layer 3 may be formed by a general shallow trench isolation method, such as those known in the art. An ion-implantation process may be carried out to form a photodiode region 9 having a first impurity-doped region 5 and a second impurity-doped region 7 in the pixel regions of the semiconductor substrate 1. The first impurity-doped region 5 and the second impurity-doped region 7 are doped with different-type impurities. For example, the first impurity-doped region 5 may be doped with n-type impurities and the second impurity-doped region 7 may be doped with p-type impurities. Although not illustrated in the accompanying drawings, a well region is formed in the semiconductor substrate 1 and a plurality of transistors is formed on the semiconductor substrate 1.

An etch stopping layer 11 may be formed on the semiconductor substrate 1 and then an interlayer dielectric layer 13 may be formed on the etch stopping layer 11. The etch stopping layer 11 protects the photodiode region 9 and the transistors (not shown) from an etching process. Although not shown, a plurality of alternating etch stopping layers and interlayer dielectric layers may be formed, and various forms of interconnections may be formed at each layer.

In the pad region, the interlayer dielectric layer 13 and the etch stopping layer 11 are patterned to form a contact hole exposing the semiconductor substrate 1. The contact hole is filled with a conductive material to form a contact plug 15. In the pad region, a conductive pad 19 is formed to overlap with the contact plug 15 for applying a voltage from an external source. A buffer oxide layer 17 and a passivation layer 21 are formed on an entire surface of the semiconductor substrate 1. The passivation layer 21 protects a photodiode region, transistors, and interconnections thereunder from external moisture or pollution. The passivation layer 21 is formed of, for example, a silicon nitride layer. The buffer oxide layer 17 alleviates stress between the passivation layer 21 and layers thereunder and may be formed of a plasma-enhanced silicon dioxide layer. The passivation layer 21 and the buffer oxide layer 17 are patterned to expose an upper surface of the conductive pad 19.

Figure 2:
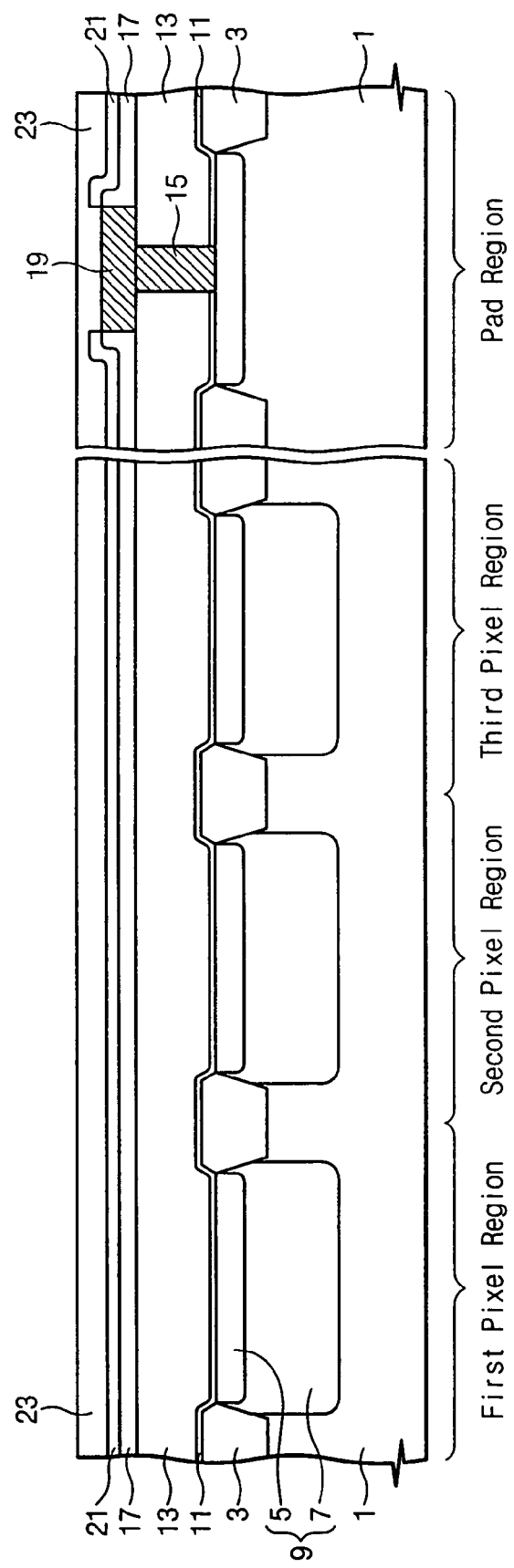

Referring to FIG. 2, a planarization layer 23 is formed over the semiconductor substrate 1 and on the passivation layer 21. The planarization layer 23 may be formed, for example, by coating and baking acryl-type photoresists to form a substantially flat upper surface. The planarization layer 23 covers and protects the upper surface of the conductive pad 19.

Figure 3:
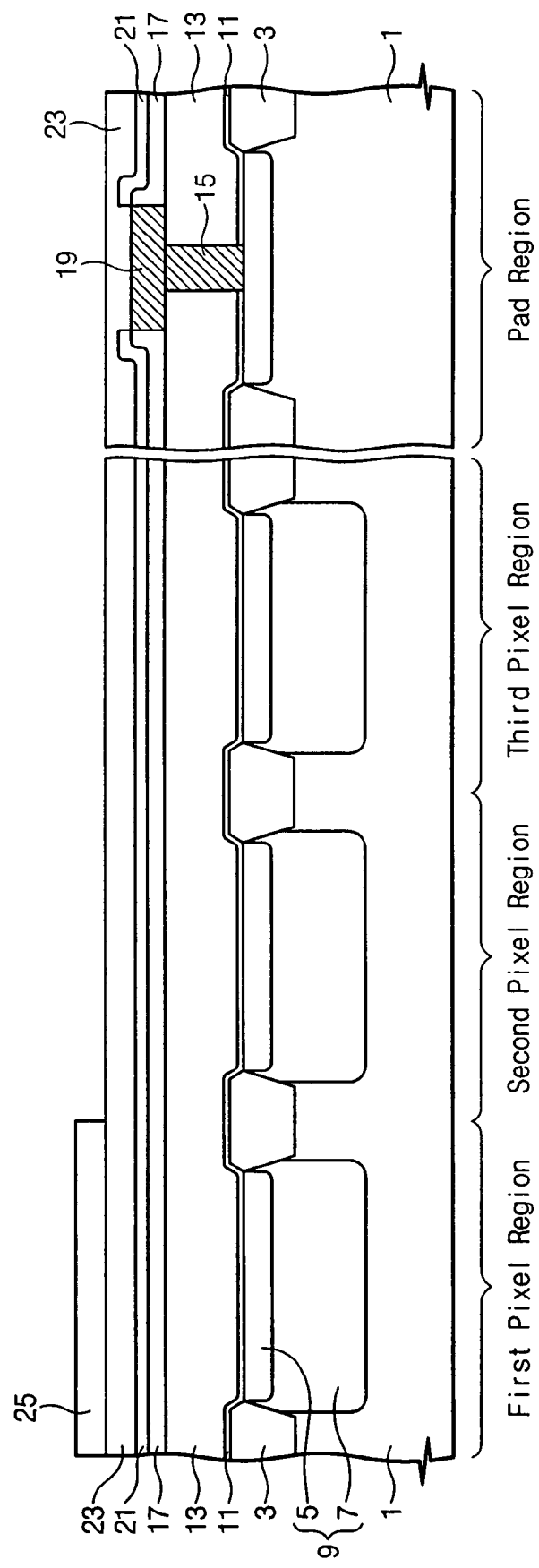

Referring to FIG. 3, a first color filter 25 having a first color is formed on the planarization layer 23 in the first pixel region. The first color filter 25 may be formed by a photolithography process including coating, soft baking, selectively exposing and developing of photoresists having at least one dye. For example, the first color may be red and, thus, the at least one dye will include a red dye, or a combination of dyes that form the color red.

Figure 4:
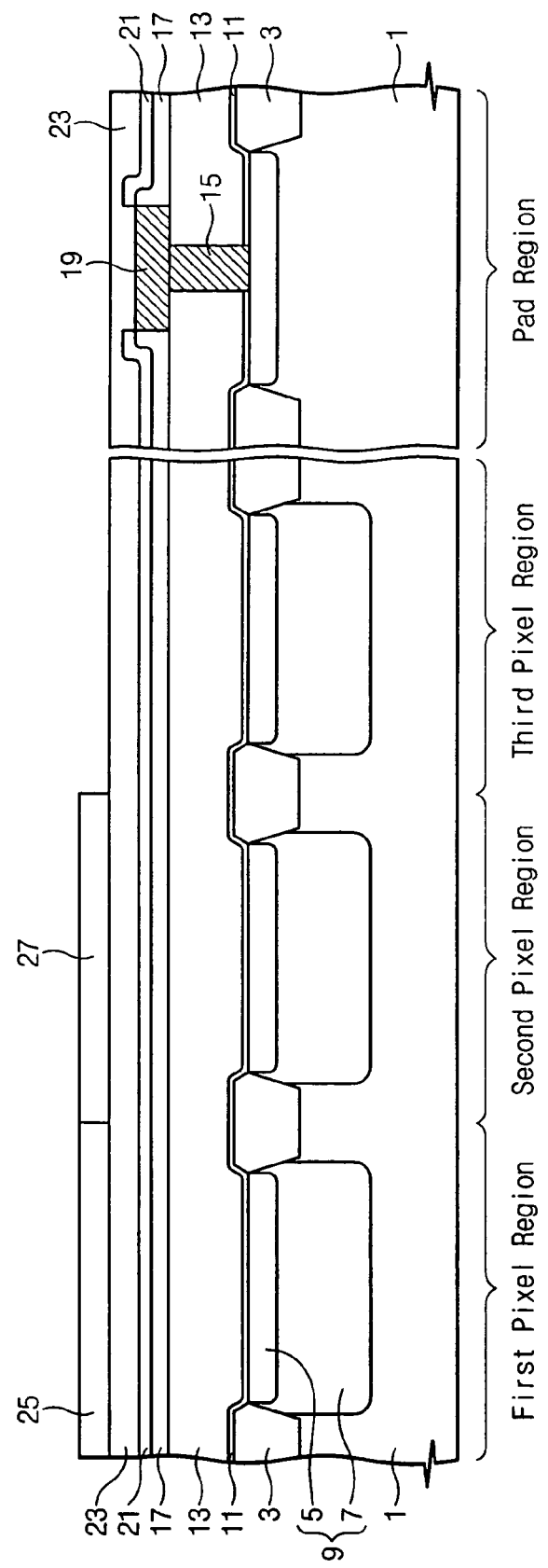

Referring to FIG. 4, a second color filter 27 having a second color is formed on the planarization layer 23 of the second pixel region. The second color filter 27 is formed by a photolithography process including coating, soft baking, selectively exposing and developing of photoresists having at least one dye. For example, the second color may be blue and, thus, the at least one dye will include a blue dye, or a combination of dyes that form the color blue.

Figure 5:
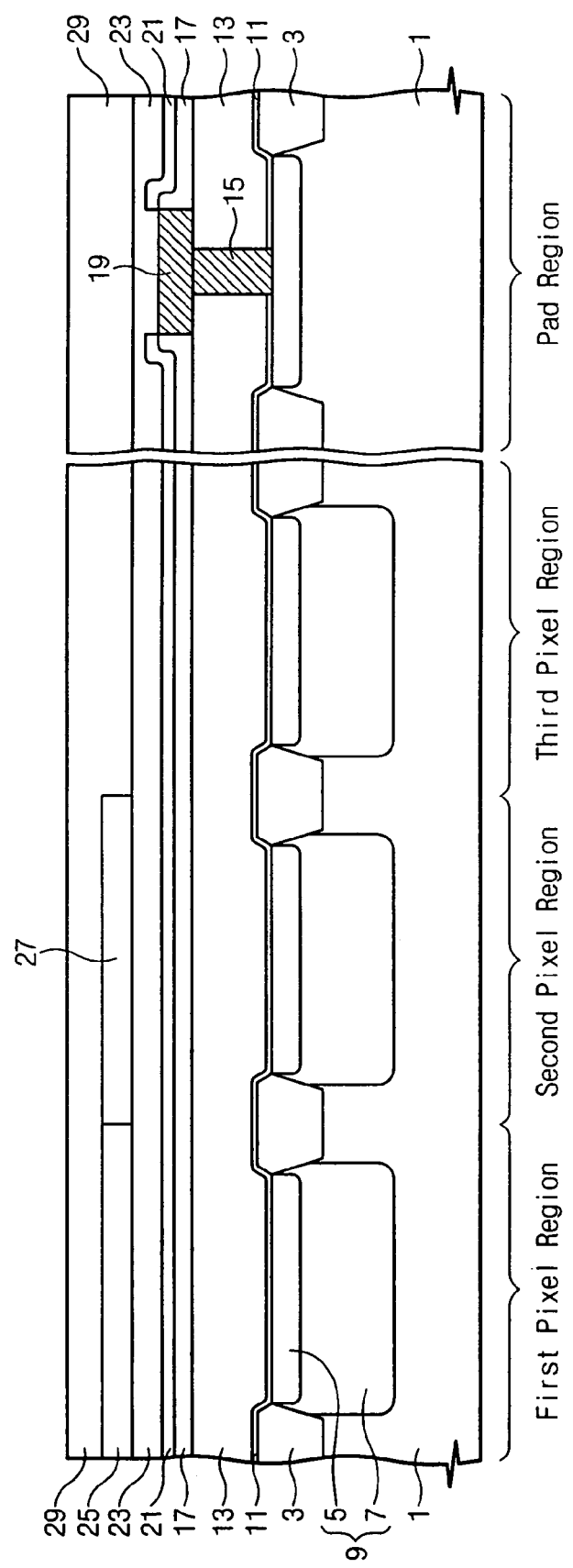

Referring to FIG. 5, a color photoresist 29 having a third color is coated over an entire surface of the semiconductor substrate 1, including being coated on the first color filter 25 and the second color filter 27, and on the substrate in the third pixel region. The color photoresist 29 is a suspension comprising a mixture of dyes, polymer resins, photo sensitizers, and solvents. For example, if the first and second colors are red and blue, then the third color may be green and, thus, the mixture of dyes will include a green dye, or a combination of dyes that form the color green.

The color photoresist 29 is flowable at a process temperature, for example, room temperature. Accordingly, by such a coating process, the color photoresist 29 is formed to have a flat or substantially flat upper surface. The color photoresist 29 is thickly formed on the planarization layer 23 and thinly formed on the first and the second color filters 25 and 27. A baking process for the color photoresist 29 is carried out to remove solvents in the color photoresist 29. The baking process may be a soft baking process, known in the art.

In the case that the color photoresist 29 is a negative type, the entire upper surface of the color photoresist 29 is exposed to light. Since the entire upper surface of the photoresist 29 is exposed to light, a photo mask is not necessary. Accordingly, an operation of aligning a photo mask is not carried out and, thus, the overall process time is shortened. Also, a developing operation is not necessary, since the color photoresist 29 is not selectively exposed. Accordingly, the process is also simplified.

In this case, i.e., where the color photoresist 29 is a negative type, a chemical reaction occurs in the color photoresist 29 when exposed to light, wherein the exposed color photoresist 29 is transformed into a transparent and hard material—as is appropriate for a color filter. After the light exposure process, a hard baking process may be carried out. In the case that the color photoresist 29 is a positive type, the exposure process may be not necessary.

Figure 6:
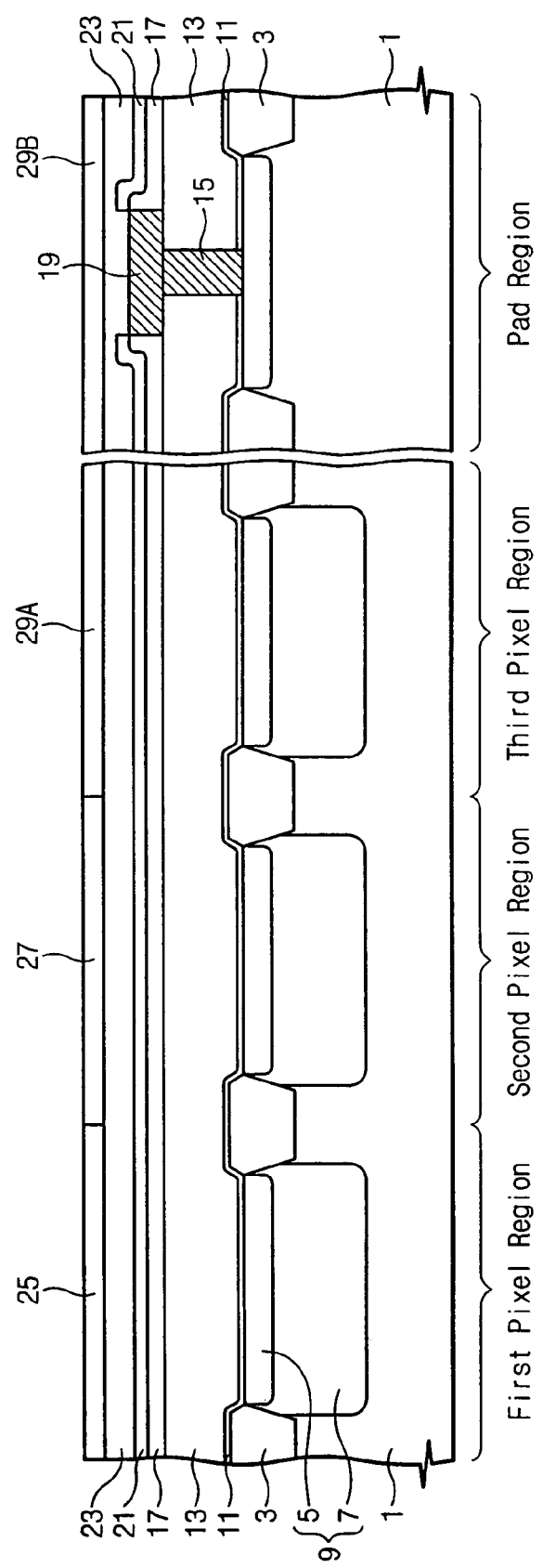

Referring to FIG. 6, a planarization process, for example, an etch back process, is carried out on the color photoresist 29 to remove the color photoresist 29 on the first color filter 25 and the second color filter 27. This process also forms, or leaves, a third color filter 29A in the third pixel region and a residuary color photoresist 29B in the pad region. The etch back process, if used, may be carried out using at least one gas selected from a group including oxygen $O_2$, nitrogen $N_2$, and carbon tetrafluoride $CF_4$. The first color filter 25 and the second color filter 27 are formed by different photolithography processes, so they could have different thicknesses. However, using the planarization process, upper parts of the first color filter 25 and the second color filter 27 may be removed so that the first color filter 25, the second color filter 27 and the third color filter 29A may be formed to have flat, or substantially flat, upper surfaces of the same, or substantially the same, heights.

Figure 7:
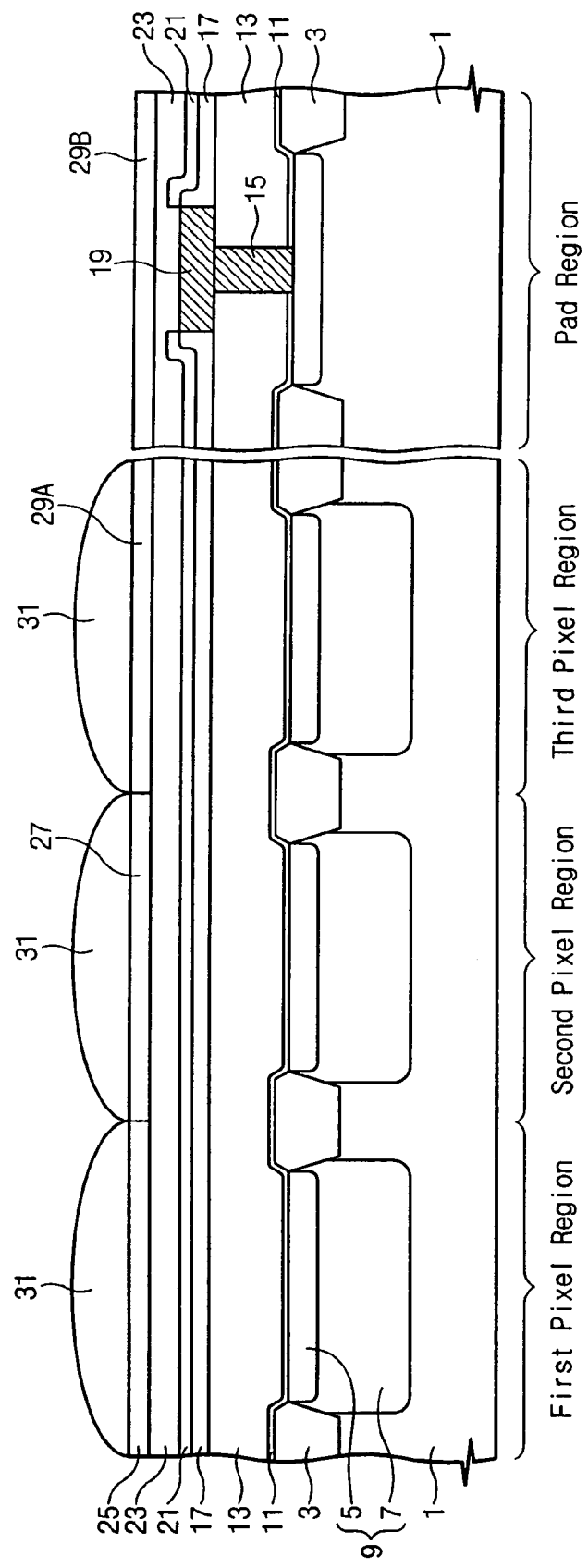

Referring to FIG. 7, micro lenses 31 are formed on the color filters 25, 27, 29A. For instance, a photoresist pattern (not shown) including a transparent acryl resin is formed by a photolithography process, the photoresist pattern is heated and reflowed to form micro lenses 31. The transparent acryl resin and photolithography process used may be those known in the art. After formation of the micro lenses 31, since the color filters 25, 27, 29A have flat upper surfaces of the same heights, a conventional upper planarization layer is not necessary and the micro lenses 31 may be formed of all the same shapes. Therefore, since an upper planarization layer is not necessary, the process may be simplified and a material cost of the upper planarization layer may be eliminated.

Figure 8:
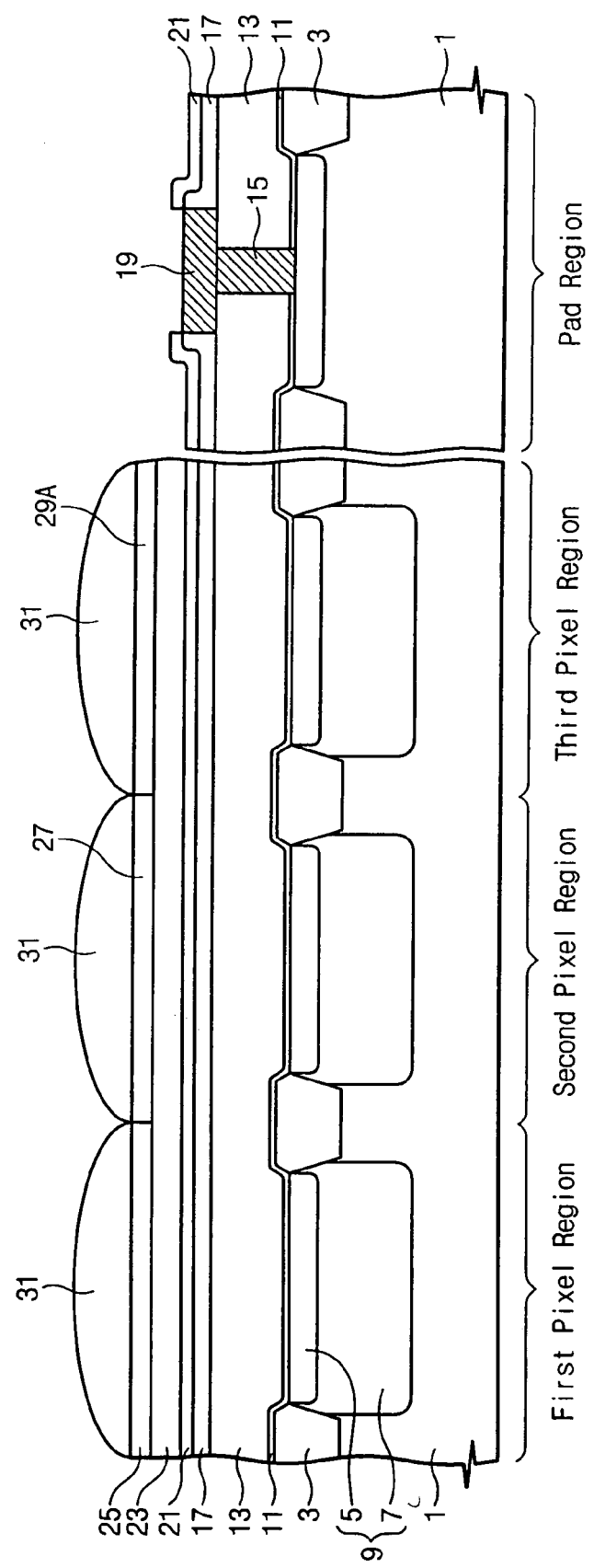

Referring to FIG. 8, a mask pattern (not shown) is formed to cover the pixel regions, but to also expose the pad region. Using the mask pattern (not shown) as an etch mask, the residuary color photoresist 29B and the planarization layer 23 on the pad region are removed to expose the upper surface of the conductive pad 19. Subsequently, a wire may be bonded to the conductive pad 19.

Continuing with FIG. 8, in the image sensor, device isolation layers 3 are located on the semiconductor substrate 1 having a first, a second, and a third pixel regions and a pad region to define active regions. A photodiode region 9 is located in the semiconductor substrate 1 of the pixel regions. An etch stopping layer 11 and an interlayer dielectric layer 13 are stacked sequentially on the semiconductor substrate 1. A contact plug 15 is arranged to electrically couple to the semiconductor substrate 1 through the interlayer dielectric layer 13 and the etch stopping layer 11. A conductive pad 19 is arranged on the contact plug 15 for applying voltages from an external source. A buffer oxide layer 17 and a passivation layer 21 are sequentially stacked on the interlayer dielectric layer 13 to expose an upper surface of the conductive pad 19. Each color filter 25, 27, 29A is arranged on the planarization layer 23 of the pixel regions and each micro lens 31 is arranged on the color filters 25, 27, 29A. The color filters 25, 27, 29A have substantially the same thicknesses and flat upper surfaces.

Without a conventional upper planarization layer in the image sensor of FIG. 8, since the micro lenses 31 are directly arranged on the color filters 25, 27, 29A, a distance between the micro lens 31 and the photodiode region 9 is shortened. As a result, light loss may be reduced to improve photo sensitivity.

In various embodiments of a method of forming an image sensor according to this disclosure, a color photoresist for a third color filter is coated and baked on the semiconductor substrate where a first color filter and a second color filter have been formed, without a selective exposure and a developing process using a photomask. The color photoresist is planarized to form a third color filer. Therefore, the overall manufacturing process may be simplified.

Also, by the use of the above described planarization process, the upper portions of the color filters are planarized to achieve color filters having flat surfaces and the same height, to accommodate placement of micro lenses without the need for a conventional upper planarization layer. Accordingly, the overall process may be simplified and a material cost of the upper planarization layer may be eliminated. Since there is no conventional upper planarization layer between a micro lens and a corresponding color filter, a distance between the micro lens and a corresponding photodiode region is shortened, thereby improving photo sensitivity.

While the foregoing describes what is considered to be the best mode and preferred embodiments of the subject disclosure, it is understood that various modifications could be made to form embodiments that would be substantively equivalent. That is, the scope of this disclosure is not limited by the embodiments described herein. Additionally, the terms "includes," "including," "comprise," and "comprising," mean without limitation, whether in the claims or specification. It is intended by the following claims to claim that which is literally described and all equivalents thereto, including all modifications and variations that fall within the scope of each claim.

What is claimed is:

1. A method of forming an image sensor, comprising:
providing a semiconductor substrate having a first pixel region, a second pixel region, and a third pixel region;
on the semiconductor substrate, forming a first color filter of a first color on the first pixel region and a second color filter of a second color on the second pixel region;
coating a negative type color photoresist of a third color on at least the third pixel region;
baking the color photoresist;
exposing the color photoresist to light;
removing at least some of the color photoresist using a planarization process to form a third color filter on the third pixel region, such that the first and second filters are without coating of the color photoresist and the first, the second and the third color filters have substantially the same height; and
forming a respective micro-lens directly on each of the first, second and third color filters.

2. The method of claim 1, wherein removing the color photoresist is accomplished using a planarization process.

3. The method of claim 2, wherein the planarization process is an etch back process.

4. The method of claim 3, wherein the etch back process is carried out using at least one gas selected from a group comprising nitrogen, oxygen, and carbon tetrafluoride.

5. The method of claim 1, further comprising, after exposing the color photoresist to light, hard baking the color photoresist.

6. The method of claim 1, further comprising, before forming the first and the second color filters, forming a planarization layer on substantially all of an upper surface of the semiconductor substrate, including forming the planarization layer on the first pixel region, the second pixel region, and the third pixel region.

7. The method of claim 6, wherein the semiconductor substrate further includes a pad region, the method further comprising, before forming the planarization layer, forming a conductive pad electrically coupled to the semiconductor substrate in the pad region, wherein the planarization layer is further formed on the conductive pad.

8. The method of claim 7, wherein performing the planarization process comprises leaving a remnant color photoresist on the pad region, the method further comprising removing the planarization layer and the remnant color photoresist to expose the conductive pad in the pad region.

9. A method of forming an image sensor, comprising:
providing a semiconductor substrate having a first pixel region, a second pixel region, a third pixel region, and a pad region;
forming a conductive pad electrically coupled to the semiconductor substrate in the pad region;
forming a planarization layer on substantially all of an upper surface of the semiconductor substrate, including forming the planarization layer on the first pixel region, the second pixel region, the third pixel region and the pad region;
forming a first color filter on the planarization layer in the first pixel region and a second color filter on the planarization layer in the second pixel region;
applying a coating of a color photoresist of a third color on the first color filter, second color filter, the third pixel region and the pad region;
baking the color photoresist;
using a planarization process to remove the color photoresist from the first and the second color filters, to form a third color filter in the third pixel region, and to form a residuary color photoresist on the pad region; and
forming a respective micro-lens directly on each of the first, second and third color filters.

10. The method of claim 9, wherein the planarization process is an etch back process.

11. The method of claim 10, wherein the etch back process is carried out using at least one gas selected from the group comprising nitrogen, oxygen, and carbon tetrafluoride.

12. The method of claim 9, wherein the color photoresist is a negative type, the method further comprising exposing the color photoresist to light before the planarization process.

13. The method of claim 12, further comprising, after exposing the color photoresist to light, hard baking the color photoresist.

14. The method of claim 9, further comprising removing the residuary color photoresist and the planarization layer to expose the conductive pad in the pad region.

15. An image sensor, comprising:
a semiconductor substrate having a first pixel region, a second pixel region, and a third pixel region;
a first color filter disposed on the first pixel region, a second color filter disposed on the second pixel region, and a third color filter disposed on the third pixel region, wherein the first, the second, and the third color filters have substantially flat upper surfaces and are of substantially the same height; and
a respective micro-lens formed directly on each of the first, second and third color filters.

16. The image sensor of claim 15, wherein the semiconductor substrate further includes a pad region, the image sensor further comprising a conductive pad electrically coupled to the semiconductor substrate in the pad region.

17. The image sensor of claim 15, further comprising a planarization layer interposed between the color filters and the semiconductor substrate.

18. A method of forming an image sensor, comprising:
providing a semiconductor substrate having a first pixel region, a second pixel region and a third pixel region;
on an upper surface of the semiconductor substrate, forming a first color filter of a first color on the first pixel region and a second color filter of a second color on the second pixel region;
coating a negative type color photoresist of a third color on substantially all of the upper surface, including coating the first and second color filters and the third pixel region;
baking the color photoresist;
exposing the color photoresist to light; and
removing the color photoresist from the upper surface using a planarization process, while maintaining a portion of the color photoresist on the third pixel region to form a third color filter on the third pixel region, such that the color photoresist is removed from the first color filter and the second color filter and the first, the second and the third color filters have substantially the same height; and
forming a respective micro-lens directly on each of the first, second and third color filters.

* * * * *